United States Patent [19]
Aiba

[11] Patent Number: 5,610,685
[45] Date of Patent: Mar. 11, 1997

[54] LED WRITE APPARATUS AND METHOD FOR MAKING SAME

[75] Inventor: Masahiko Aiba, Nara, Japan

[73] Assignee: Sharp Kabushiki Kaisha, Osaka, Japan

[21] Appl. No.: 416,286

[22] Filed: Apr. 4, 1995

[30] Foreign Application Priority Data

May 20, 1994 [JP] Japan .................................. 6-106394

[51] Int. Cl.$^6$ ........................... G03B 27/00; G03B 27/54; B41J 2/45
[52] U.S. Cl. .............................................. 355/67; 347/238
[58] Field of Search ........................ 355/1, 44; 347/244, 347/238, 241, 130

[56] References Cited

U.S. PATENT DOCUMENTS

| | | | |
|---|---|---|---|
| 4,211,586 | 7/1980 | Fang et al. | 148/175 |
| 4,533,148 | 11/1985 | Behrens et al. | 347/244 |
| 4,700,206 | 10/1987 | Yamakawa . | |
| 4,978,974 | 12/1990 | Etzel | 347/244 X |
| 5,160,965 | 11/1992 | Koide | 347/244 X |
| 5,337,074 | 8/1994 | Thornton | 346/107 |

FOREIGN PATENT DOCUMENTS 3-188755  8/1991  Japan .

Primary Examiner—Matthew S. Smith
Assistant Examiner—Herbert V. Kerner
Attorney, Agent, or Firm—Nixon & Vanderhye P.C.

[57] ABSTRACT

It is an object of the invention to provide a LED write apparatus wherein the arrangement step of LED chips is eliminated by constituting the LED head by a single LED chip composed of LEDs and electrical connection of the respective LEDs with driving circuits is carried out with ease.

A LED head chip is constituted in such a manner that 2400 LEDs in all whose width a is selected to be narrow, namely about 10 μm are formed on a Si substrate having a smaller width (about 30 mm) than that of a photosensitive drum (length of A4 size: 210 mm) through a GaAs substrate and as well peripheral circuits including a driving circuit such as a transistor are integratedly formed on the Si substrate. The light from the LED head chip is magnified via a lens to form an image on the photosensitive drum.

29 Claims, 15 Drawing Sheets

5,610,685

LED WRITE APPARATUS AND METHOD FOR MAKING SAME

BACKGROUND OF THE INVENTION

The present invention relates to an image forming apparatus which converts electric information to photo-information to record in a recording medium such as a photoconductor.

Printing apparatus in which electrophotographic technology is applied include laser printers in which a photosensitive drum is irradiated with a laser beam using a rotary scanning mirror (a polygon mirror), and LED printers wherein light emitting diodes (LEDs) corresponding to picture elements are arranged in the scanning direction of the recording medium and in a vertical direction to expose a photosensitive drum to the LED light, FIG. 16 is a view showing a conventional LED printers, photosensitive drum (recording medium) 101 and which uniformly provides the surface of the photosensitive drum with charges. A LED head 102 converts input electric signals to optical ON/OFF signals to which the photosensitive drum 101 is exposed through a lens array 103 without reducing/magnifying. As a result, an electrostatic latent image corresponding to the electric signals input to the LED head 102 is formed on the surface of the photosensitive drum. The photosensitive drum surface where the electrostatic latent image is formed interacts with a developing apparatus 104 to which a bias voltage is applied,. and toner is transferred to the photosensitive drum surface to develop the electrostatic latent image. The photosensitive drum surface developed by the toner is rotated to reach a transcribing portion. On the other hand, a paper sheet 107 is fed from a sheet feeding portion 106 to the transcribing portion, and the toner on the photosensitive drum surface is pulled by a corona ion having a polarity reverse to that of the charge of the toner onto the photosensitive drum surface, and discharged from a transcription charger 105 to form a latent image on the paper sheet 107. However, the image on the printing paper sheet 107 in this state is not stable because it is electrostatically deposited. A stable image is obtained in such a manner that the toner permeates the paper sheet by heating and melting using a fixing apparatus 108.

FIG. 17 is a view showing an internal structure of an embodiment of the LED head 102. The embodiment of the LED head 102 is a head used for a printer having a resolution of 300 dots per inch (dpi), which can be obtained by arranging LEDs having four sides of 60 μm at pitches of 85 μm. It is necessary to arrange about 2400 LEDs at the pitches in order to obtain an image of the full length of the longer side of an A4 size paper sheet, having a resolution of 300 dpi. This necessity is conventionally satisfied in such a manner that 38 LED chips 110, each having 64 rectangular LEDs 109 with each LED having four sides of about 60 μm and arranged at about 85 μm pitches, are accurately arranged and fixed on a substrate 111. Each LED 109 of the LED chip 110 is connected to a driving circuit chip 113 via a bonding wire 112 and are independently controlled with an input signal input from an input connector 114.

Such a conventional constitution, however, has the following drawbacks.

1) Since an industrially manufacturable LED chip is limited in size for cost reasons, it is not possible to constitute a LED head having conventional sizes (e.g., identical with the shorter side of a A4 size paper sheet) using a single LED chip.

The LED chip is manufactured by repeating etching of a GaAs or GaAl wafer similar to the manufacture of an IC. According to industry and trade convention, a 10 in. ingot (an ingot is sliced to make wafers) is the maximum size of an ingot for manufacturing a wafer. When a LED chip is manufactured from a 10 in. wafer, the largest practical size of a LED chip is about 241 mm. When the LED chip is mass-produced, the largest practical size thereof is about 8 inches. Accordingly, the LED head 102 is conventionally manufactured with a plurality of small size LED chips 110 (about 38 chips). Such constitution, however, requires a high accuracy on the order of a few μm in forming a row of the LED chips, which further requires a large size apparatus for manufacture. Even then the yield is unsatisfactory. For example, when a LED chip having a length of 241 mm (9.5 in.) and a resolution of 600 dpi is manufactured from a 10 in. wafer, it is difficult to obtain good quality from all of the 5700 elements manufactured on the LED chip.

2) Conventionally, the LED driving circuit chip 113 and the LED chip 110 are separate chips. Additionally, 2400 LEDs 109 are respectively wired to the driving circuits via bonding wires. Materials for manufacturing the driving circuit chip and LED chip are limited due to their characteristics, and there are no means available for forming both chips on the same substrate. Accordingly, the driving circuit chip and the LED chip are formed from a Si substrate and from a GaAs or GaAl substrate, respectively, and the wiring thereof is carried out by wire bonding. This practice lowers the reliability of the LED head increases cost because of the substantial time expended in manufacturing.

SUMMARY OF THE INVENTION

It is an object of the invention to provide (1) a LED write apparatus in which the arrangement step of LED chips is eliminated using an LED head that is a single LED chip composed of LEDs, and (2) electrical connection of the respective LEDs with driving circuits is carried out simply.

The invention provides a LED write apparatus which forms an image on a recording medium by scanning the recording medium while controlling individual LEDs, the apparatus comprising:

a LED head formed by arranging a plurality of LEDs in one row, the LED head constituted by forming the plurality of LEDs on a single substrate having a smaller width than that of the recording medium, and magnifier/projector for magnifying the width of light in the arrangement direction of the LEDs of the LED head to the width of the recording medium and for projecting that light on the recording medium.

The LEDs are formed in such a shape that the length of the respective LEDs in the direction vertical to the width direction of the LEDs is longer than the width of the LEDs. The width of light in the direction vertical to the arrangement direction of the LEDs of the LED head is reduced to that nearly equal to the width of the light of one LED in the arrangement direction.

The invention provides a LED write apparatus comprising a plurality of LEDs arranged in one row and a peripheral circuit controlling the plurality of LEDs individually, wherein the peripheral circuit and the plurality of LEDs are formed on one and the same semiconductor substrate, and the peripheral circuit and the LEDs are electrically connected by a semiconductor process.

According to the invention, it is possible to make the width of a practical LED head smaller than that of a recording medium in the constitution process of the LED head because the recording medium is exposed to light after the width of the LED head light has been magnified by magnifier/projector. Accordingly, in manufacturing the LED head, all the LEDs required for exposing the recording medium in its full width to the LED light can be formed on one substrate without dividing the LED head into a plurality of LED chips.

According to the invention, it is possible to obtain a plenty of emitted light from each LED by specifying the LED shape. Since the LED head of the apparatus has a small width, the width of the respective LEDs also is small. Accordingly, if the ratio of width to length of the LED is 1:1 like a usual LED, the quantity of light emitted from the LED is smaller. On the other hand, if the LED has a longer length, the emission area of the LED increases and plenty of emitted light can be obtained in spite of its narrow width. As a result, such LED write apparatus may be applied also to an image forming apparatus with high speed light scanning.

According to the invention, the light from the LED is projected on a recording medium, and the width of the projected light in the length direction is reduced. The length of the LED of the invention is longer than the width thereof. However, when the ratio of the width to the length is extremely small, the image which is formed by projecting the LED light direct on the recording medium is susceptible to deformation. For that reason, the width of the light in the LED length direction is reduced to the extent that it becomes almost equal to the width of the light in the LED width direction prior to projection. The image is prevented from being deformed at the time of projection.

Further, according to the invention, the peripheral circuit and the LED are formed on the same substrate, which are connected by a semiconductor process. As a result, wire bonding the LED head and peripheral circuit chip is unnecessary. Since the LED head can be constituted by forming all the LEDs on the same substrate, there is no need to physically arrange a plurality of LED chips in a row which improves the alignment quality of the LED head. Even in the case where the width of each LED becomes smaller due to making the width of the LED head small, it is possible to obtain plenty of light from each LED. Accordingly, the LED write apparatus may be applied to a high speed image forming apparatus.

In the case where an image is formed on a photosensitive drum by the use of LEDs having an extremely long length in comparison with width, a deformation-free image can be formed because the width of the light in the LED length direction is reduced by the reducing and projecting means. Since the LED head is constituted as a chip, the manufacturing steps are simpler in comparison with those of the conventional case where the LED head and peripheral circuits are constituted by separated chips. Also, the wire bonding step can be eliminated, resulting in improved reliability.

BRIEF DESCRIPTION OF THE DRAWINGS

Other and further objects, features, and advantages of he invention will be more explicit from the following detailed description taken with reference to the drawings wherein.

DETAILED DESCRIPTION OF THE PREFERRED EMBODIMENTS

Figure 1:
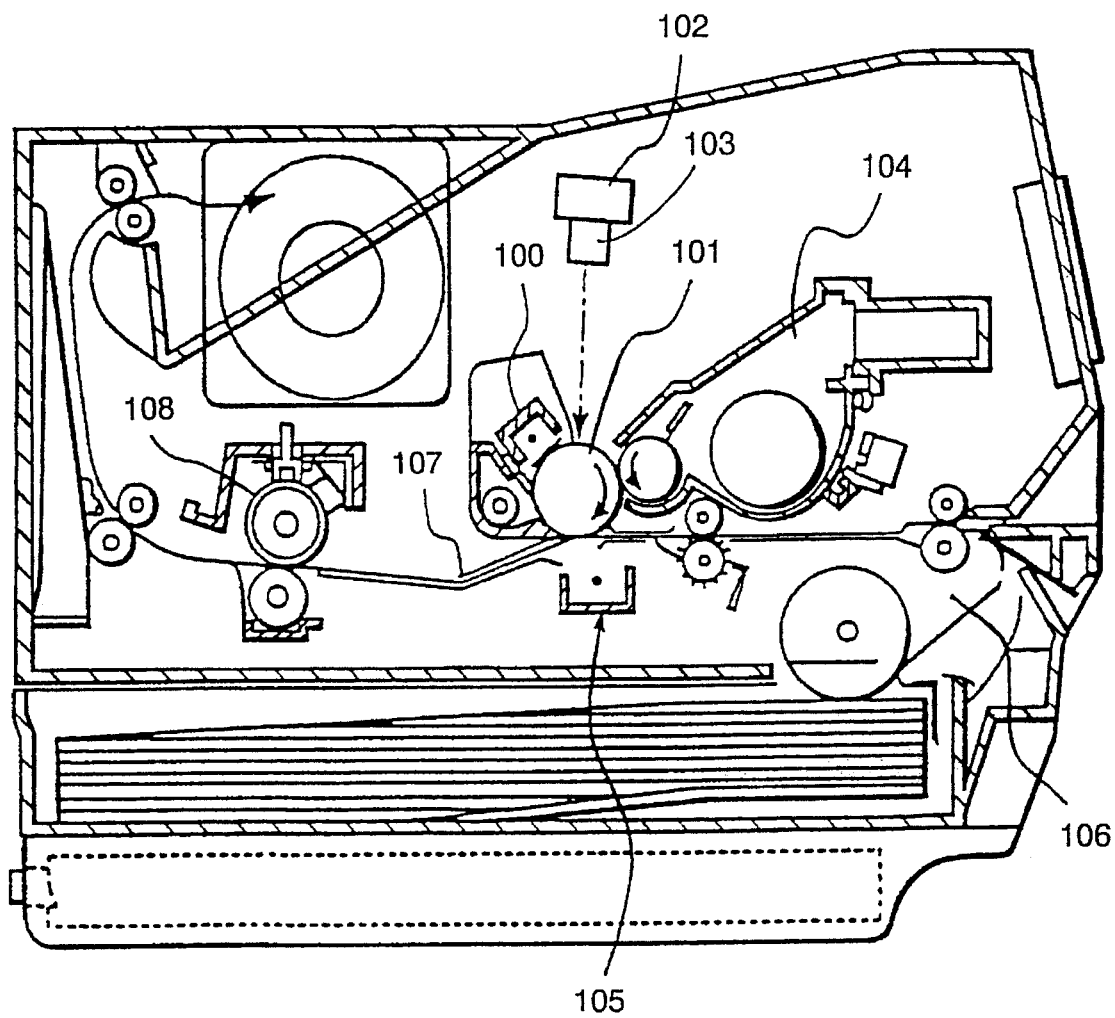
FIG. 1 is a view of the entire constitution of an image forming apparatus to which a LED write apparatus embodying the invention is applied.

Now referring to the drawings, preferred embodiments of the invention are described below.

Figure 15:
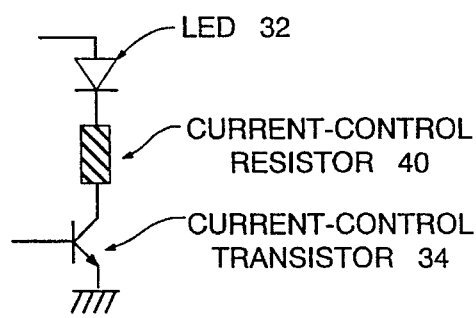
FIG. 15 is a view showing a circuit configuration for correcting the light intensity characteristic.
Figure 16:
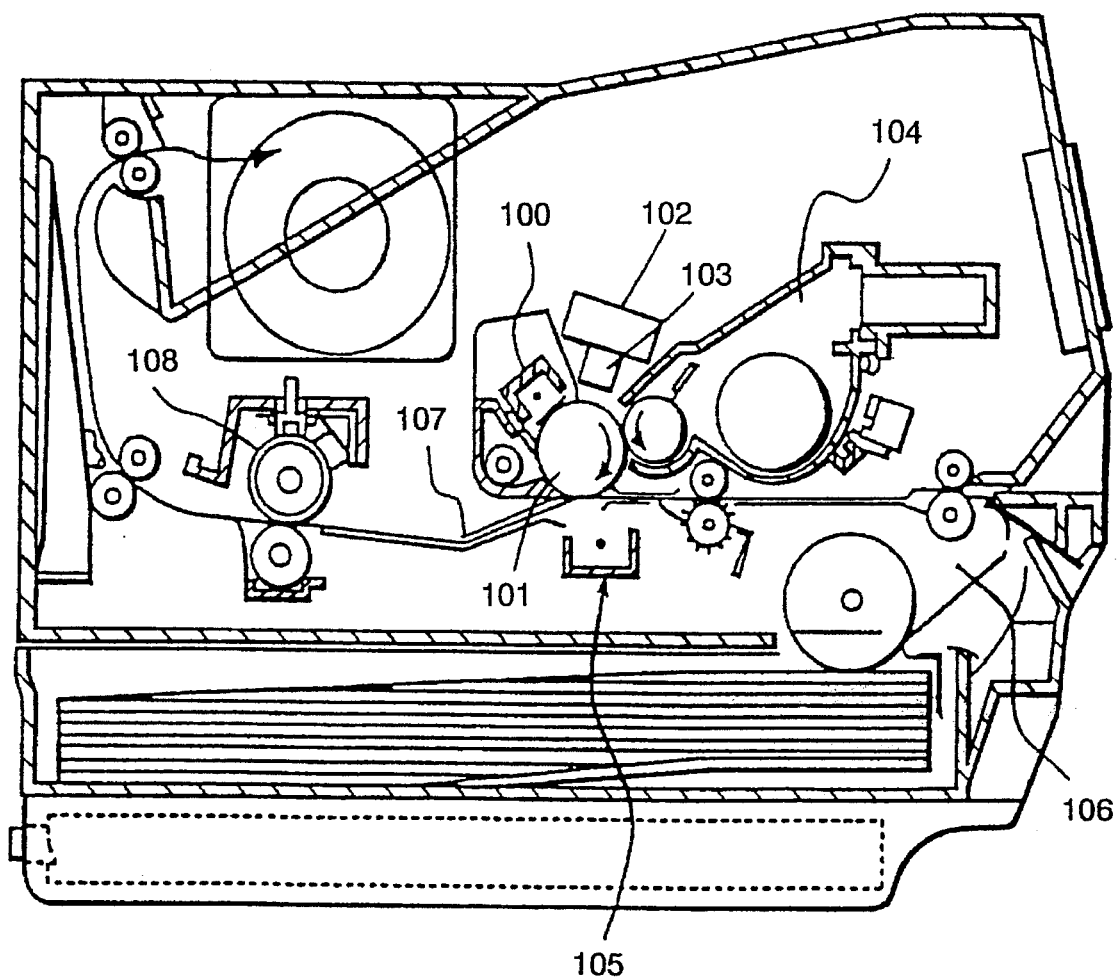
FIG. 16 is a view showing the constitution of a usual LED printer.
Figures 17A, 17B:
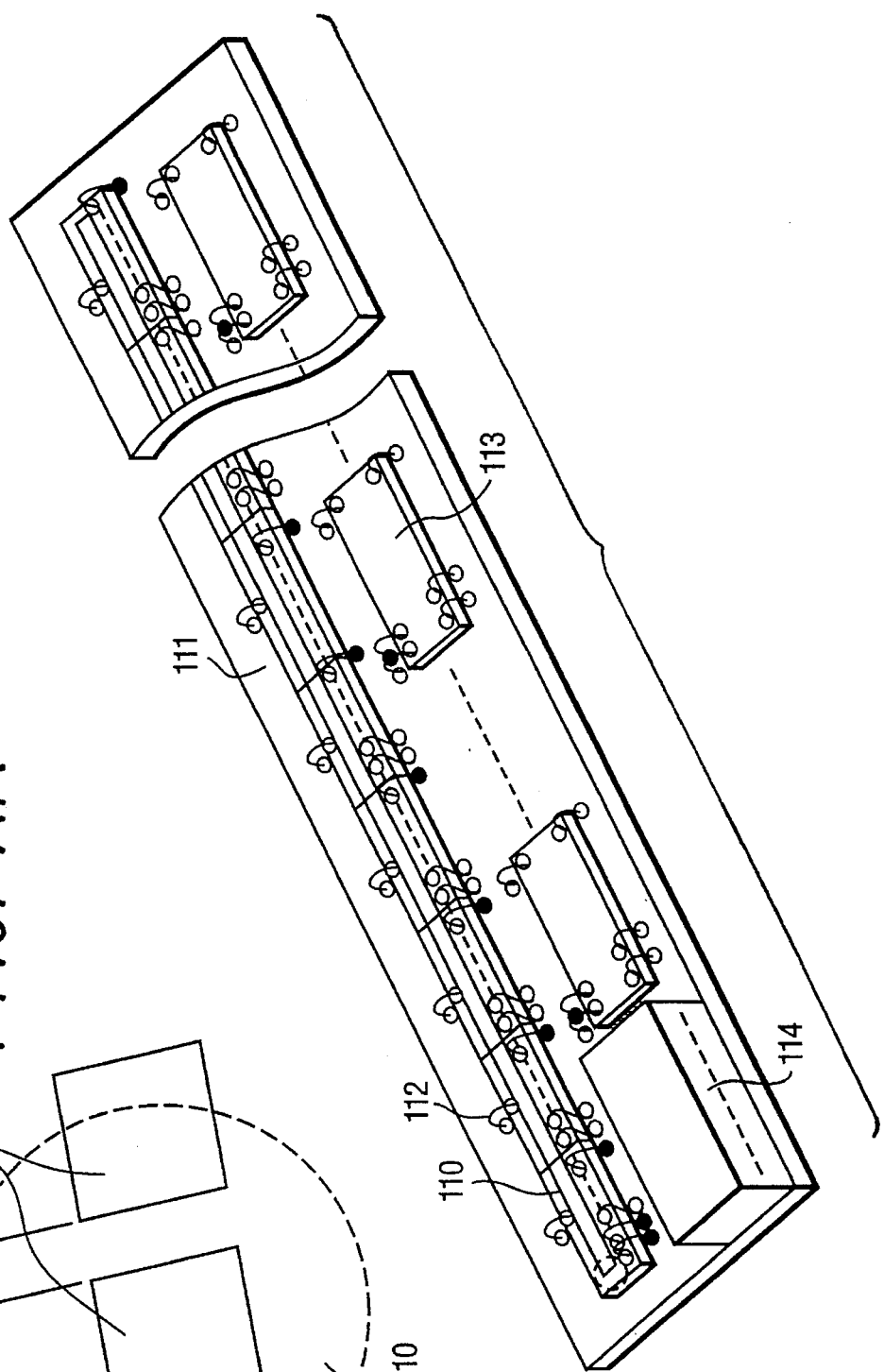
FIG. 17 is a view showing the constitution of a conventional LED head.

A first embodiment of the invention will be described. FIG. 1 is a view of an image forming apparatus to which a LED write apparatus embodying the invention is applied. FIG. 1 differs from FIG. 15 in the LED write apparatus. A charger 100 opposes a photosensitive drum (recording medium) 101, and uniformly provides the surface of the photosensitive drum with charges. A LED write apparatus converts input electric signals to optical ON/OFF signals to which the photosensitive drum 101 is exposed through a lens array 103. As a result, an electrostatic latent image corresponding to the electric signals input to the LED write apparatus 102 is formed on the surface of the photosensitive drum. The photosensitive drum surface where the electrostatic latent image is formed interacts with a developing apparatus 104 to which a bias voltage is applied, and toner is transferred to the photosensitive drum surface corresponding to develop the electrostatic latent image. The photosensitive drum surface developed using the toner is rotated to reach a transcribing portion. A paper sheet 107 is fed from a sheet feeding portion 106 to the transcribing portion, and the toner on the photosensitive drum surface having a polarity reverse to that of the charge of the toner on the photosensitive drum surface, is discharged from a transcription charger 105 to form a latent image on the paper sheet 107. The image on the paper sheet 107 is not stable because it is electrostatically deposited. A stable image is obtained so that the toner permeates the paper sheet by heating and melting and is fixed by a fixing apparatus 108.

Figure 2A:
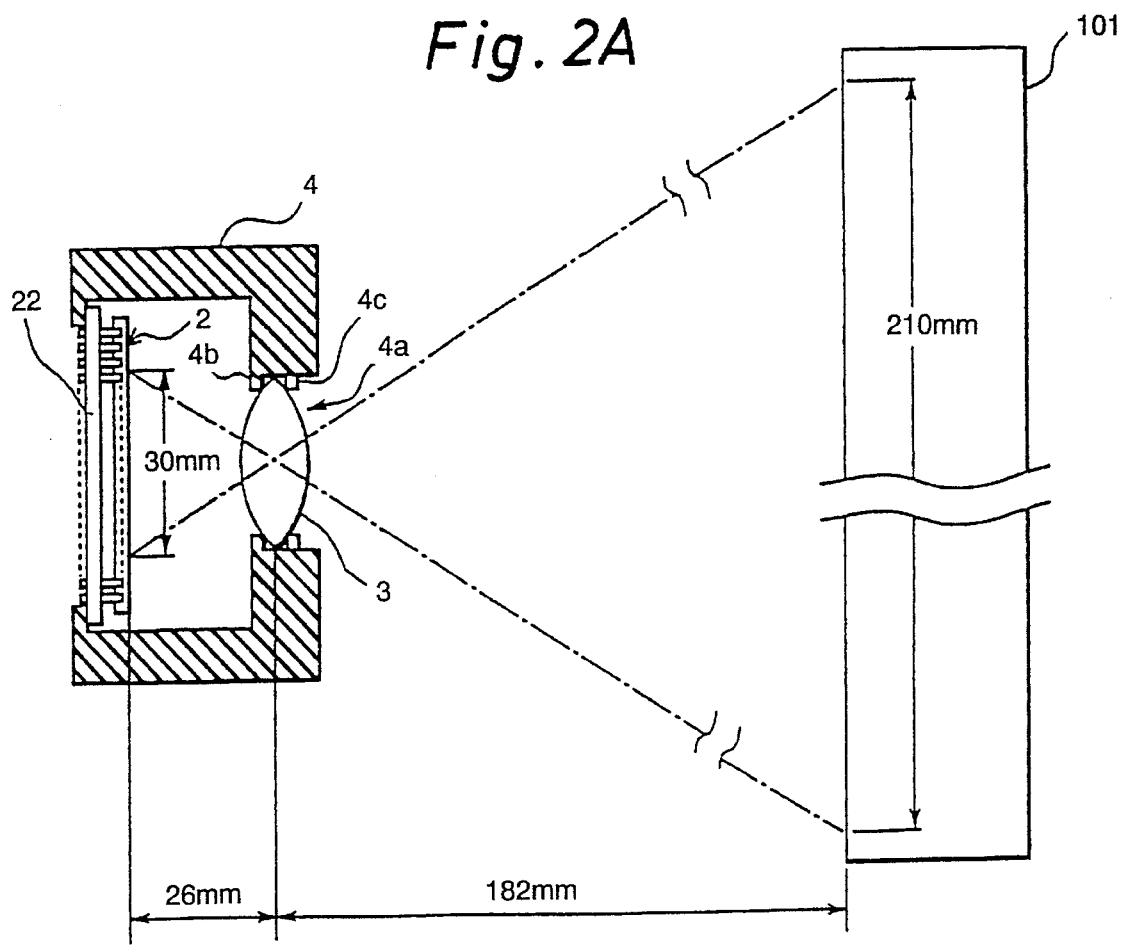
FIGS. 2A, 2B are a plan and a front view of the LED write apparatus embodying the invention, respectively.
Figure 2B:
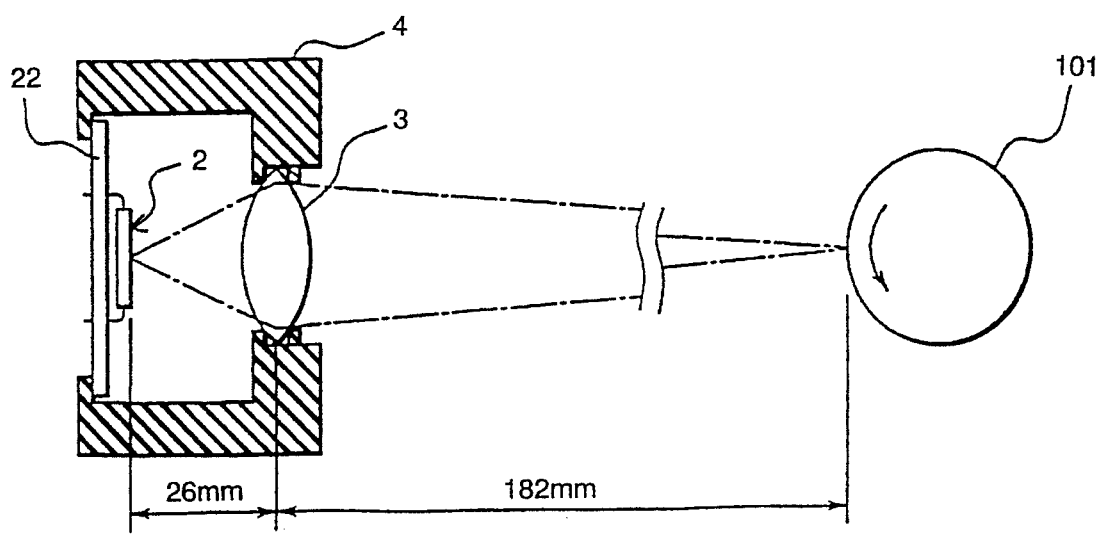
Figure 3:
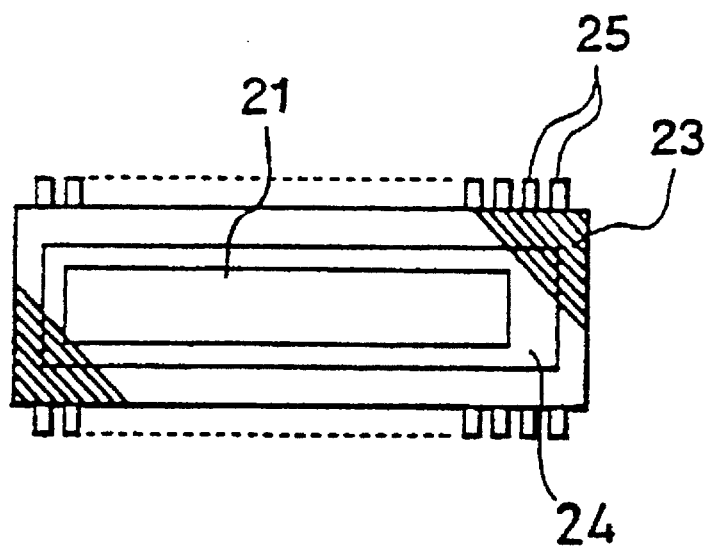
FIG. 3 is a plan view of a LED head.
Figure 4:
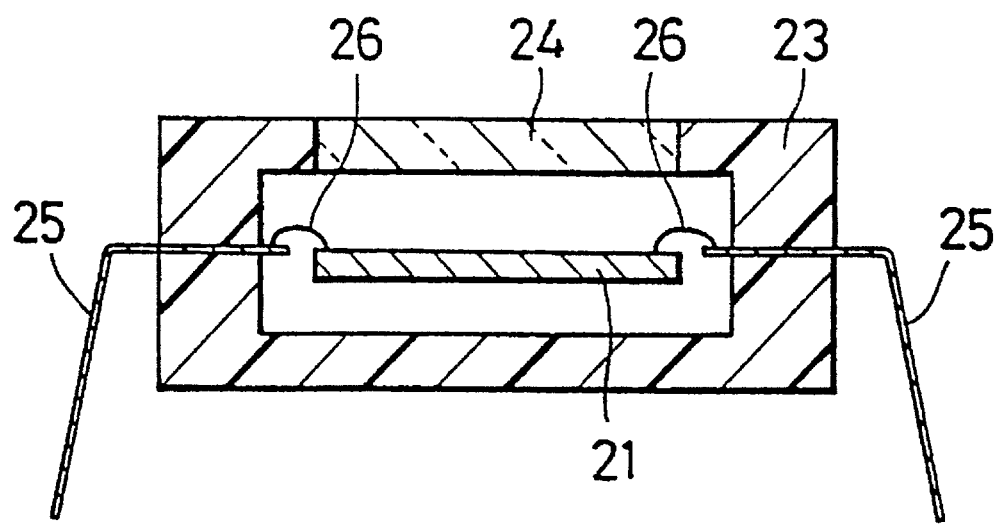
FIG. 4 is a sectional view of the LED head of FIG. 3.
Figure 5A:
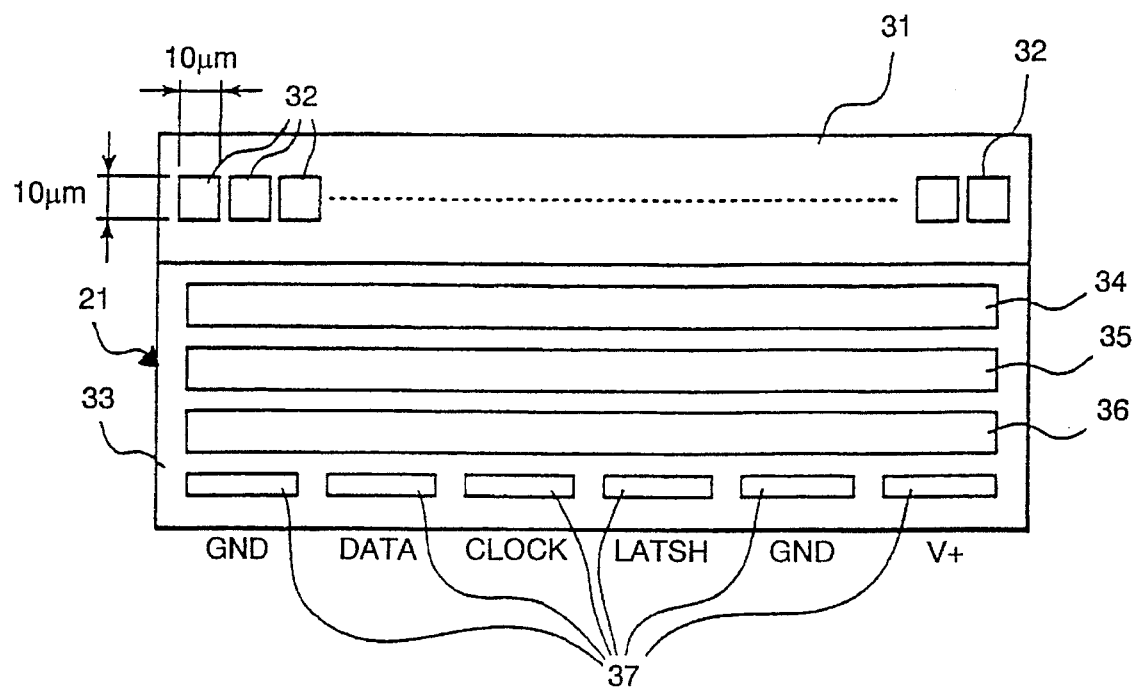
FIGS. 5A, 5B are a plan and a sectional view of a LED head chip.
Figure 5B:
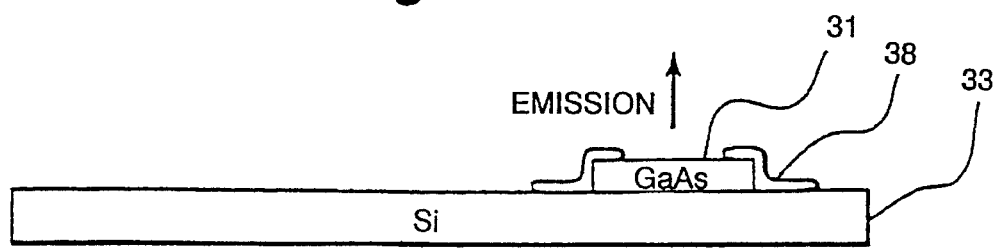
Figure 6:
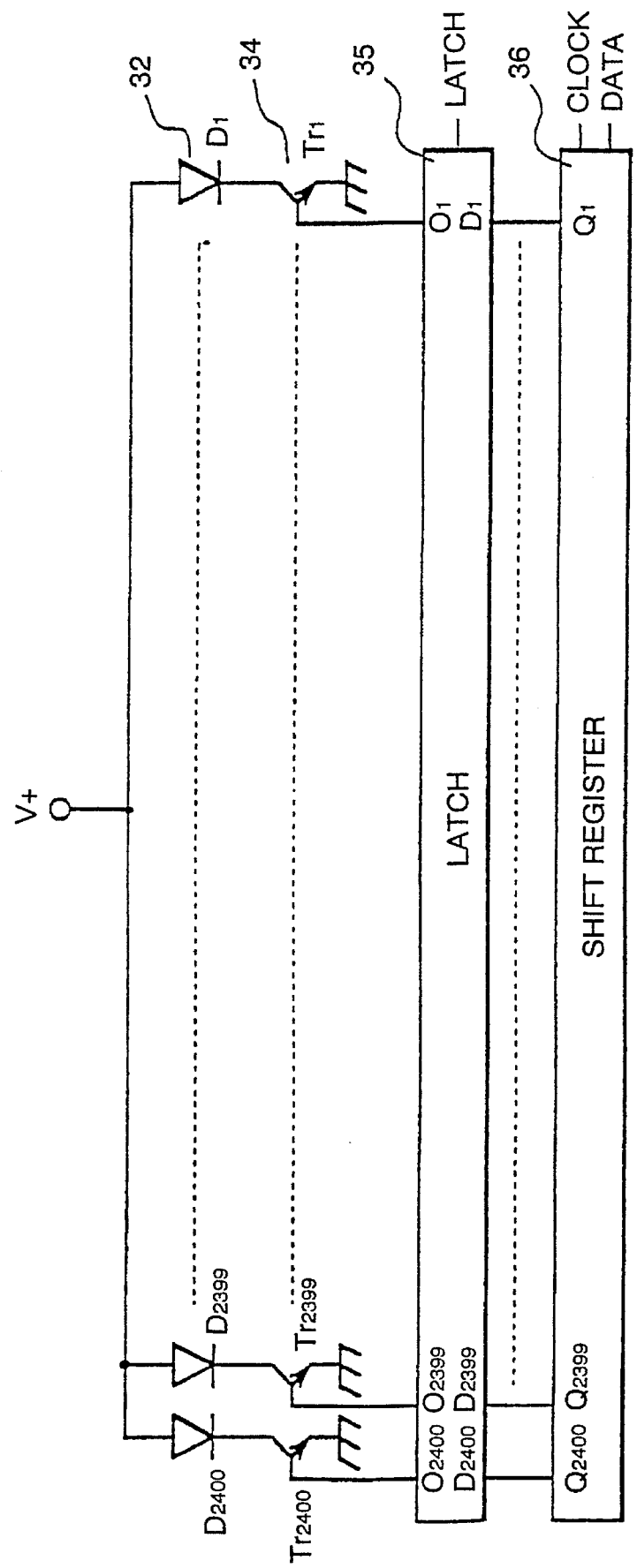
FIG. 6 is a view showing a circuit configuration of the LED head chip.

FIGS. 2–5 are views explaining the first embodiment. FIG. 2A is a plan view in the plane direction of the photosensitive drum 101 (the direction along the rotation axis of the photosensitive drum) and FIG. 2B is a front view. FIG. 3 is a plan view of a LED head, FIG. 4 is a sectional view of the LED head, and FIGS. 5A, 5B are a plan and a sectional view of a LED head chip. FIG. 6 is a view showing a circuit configuration of the LED head chip.

The LED head write apparatus comprises a LED head 2 and a round convex lens 3, which are held with a frame 4. The round convex lens 3 is held with a lens holding portion 4a which is a circular hole formed in the frame 4. In the lens holding portion 4a is a stopper 4b, and the round convex lens 3 is fixed between the stopper 4b and a lens fixing ring 4c.

The LED head 2 is a one in which an LED head chip 21 sealed in a IC package 23 is mounted on a mounting substrate 22. The LED head chip 21 is sealed in the IC package 23 after being connected on a lead frame 25 by bonding wires 26. A transparent glass 24 is arranged on the front side of the IC package 23. Thereby the light from the LED head chip 21 travels through the transparent glass 24. Then the photosensitive drum 101 is exposed to the light through the round convex lens 3.

Constitution examples and manufacturing steps of the LED head chip 21 will now be described. The LED head chip 21 includes 2400 LEDS corresponding to the lateral width of A4 size and a driving circuit for each LED. When being formed on a semiconductor substrate, a LED having a width of 30 mm is considered advantageous in terms of cost. Accordingly, in this embodiment, 2400 LEDs 32 are formed on one LED substrate (GaAs: gallium arsenide) 31 having a width of 30 mm (semiconductor substrate width: 30 μm). In this case, taking the insulation of the 2400 LEDs and insulation thereamong into consideration, the four sides of one LED 32 comes to about 10 μm (i.e., The LED width a:=10 μm).

On the other hand, a periphery circuit including a driving circuit for a LED is formed on a Si substrate 33 measuring about 30 mm×8 mm. The peripheral circuit comprises 2400 transistors 34, a latch circuit 35, a shift register 36 and a bonding pad 37 for connecting an input signal. Although the formation procedures for the peripheral circuit are the same as those of a conventional peripheral circuit chip, a space for mounting the LED substrate 31 is secured in the vicinity of the transistors 34. The LED substrate 31 is mounted and connected physically on the Si substrate 33 on which the peripheral circuit is formed by soldering, welding or the like, and subsequently the peripheral circuit is electrically connected to a terminal of each LED 32 on the LED substrate 31. The electrical connection method may be a semiconductor process such as aluminum vapor deposition/etching (aluminum wiring 38). The LED head chip 21 is thus formed. Subsequently, after being fixed to the lead frame 25, the LED head chip 21 is sealed in the IC package 23.

In the above-mentioned manner, the step of forming the LEDs 32 on the LED substrate 31 and the step of forming the peripheral circuit on the Si substrate 33 are separately carried out and subsequently both are physically connected to constitute a LED head chip.

A peripheral circuit including a driving circuit is formed on the Si substrate 33. Thereafter the step of growing a GaAs film on the Si substrate 33 is carried out to form the LED 32 on the GaAs film. Subsequently the LED 32 is electrically connected to the peripheral circuit using aluminum vapor deposition/etching. In this manner, it is possible to carry out all the manufacturing steps of the LED head chip in the semiconductor process.

Because both the LED 32 and the peripheral circuit are mounted on one chip, wire bonding is not necessary for connecting the LED 32 and the peripheral circuit. The necessary wiring is formed in the semiconductor process, which leads to improved reliability of the wiring and cost saving.

Further, a GaAs substrate is usually expensive in comparison with a Si substrate, and therefore, forming not only LEDs, but also a periphery circuit on the GaAs substrate results in increase in cost. Accordingly, like the embodiment, when only the LEDs 32 are formed on the GaAs substrate 31 and the periphery circuit is formed on the Si substrate 33, it is possible to manufacture a LED head chip economically. Of course, if the manufacturing is carried out regardless of cost, the LEDs and the peripheral circuit may be all formed on the same substrate. Thereby, the number of steps carried out in the manufacture of a LED head chip are reduced, resulting in easy manufacturing.

Next, an image writing state with the LED write apparatus constituted as above will be described. In image writing, image signals for one line are input as serial signals into the LED head chip 21 and stored in the shift register 36. The image signals for one line are transferred to the latch circuit 35 with latch signals, each output signal is connected to each LED 32 via a transistor 34 and driven.

In the case where there is sufficient emission time for one line, the output of the latch circuit 35 may be transmitted through a multiplex circuit so that the LED 32 is matrix-driven. As a result, time shared driving in which 2400 LEDs are divided into 8 to 64 blocks may be carried out, which leads to the reduction of internal wiring and driver circuits.

The light emitted from the LED head chip 21 driven in such manner is transmitted through the round convex lens 3 and imaged on the photosensitive drum 101. At that time, the width of the light output from the LED head chip 21, which is 30 mm, is magnified on the photosensitive drum up to a necessary image width (in this example, length of A4 size: 210 mm). Therefore the width of the light outputted from the LED head chip 21 is magnified via the round convex lens seven times. At that time, the light from each LED is magnified from light having four dimensions of 10 μm to one having four dimensions of 70 μm. An example of constitutional specifications (e.g., a lens position, a focal distance for such magnification) is as follows:

distance between LED head chip and round convex lens : 26 mm distance between round convex lens and photosensitive drum : 182 mm lens aperture : 24 mm focal distance : 22.75 mm Subsequently, while the photosensitive drum is rotated in the arrow direction of FIG. 2B, the 2400 LEDs on the LED head chip 21 are turned on/off according to the input signal. Thereby an image (electrostatic latent image) having a width of 210 mm is formed on the photosensitive drum 101.

Figure 7:
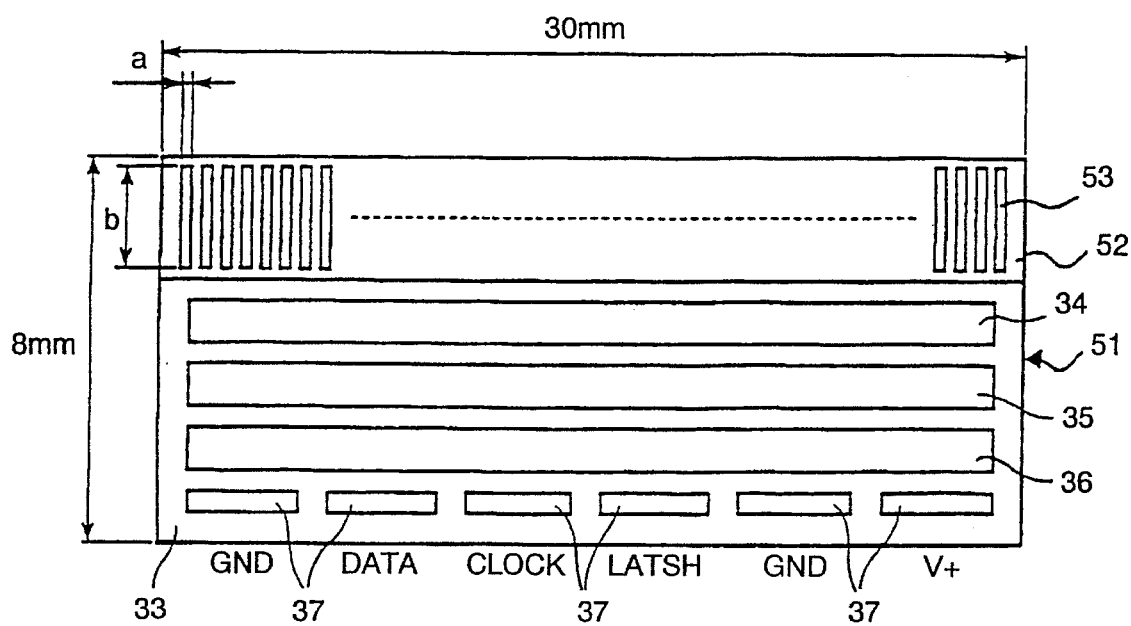
FIG. 7 is a plan view of one constitution of the LED head chip.
Figure 8A:
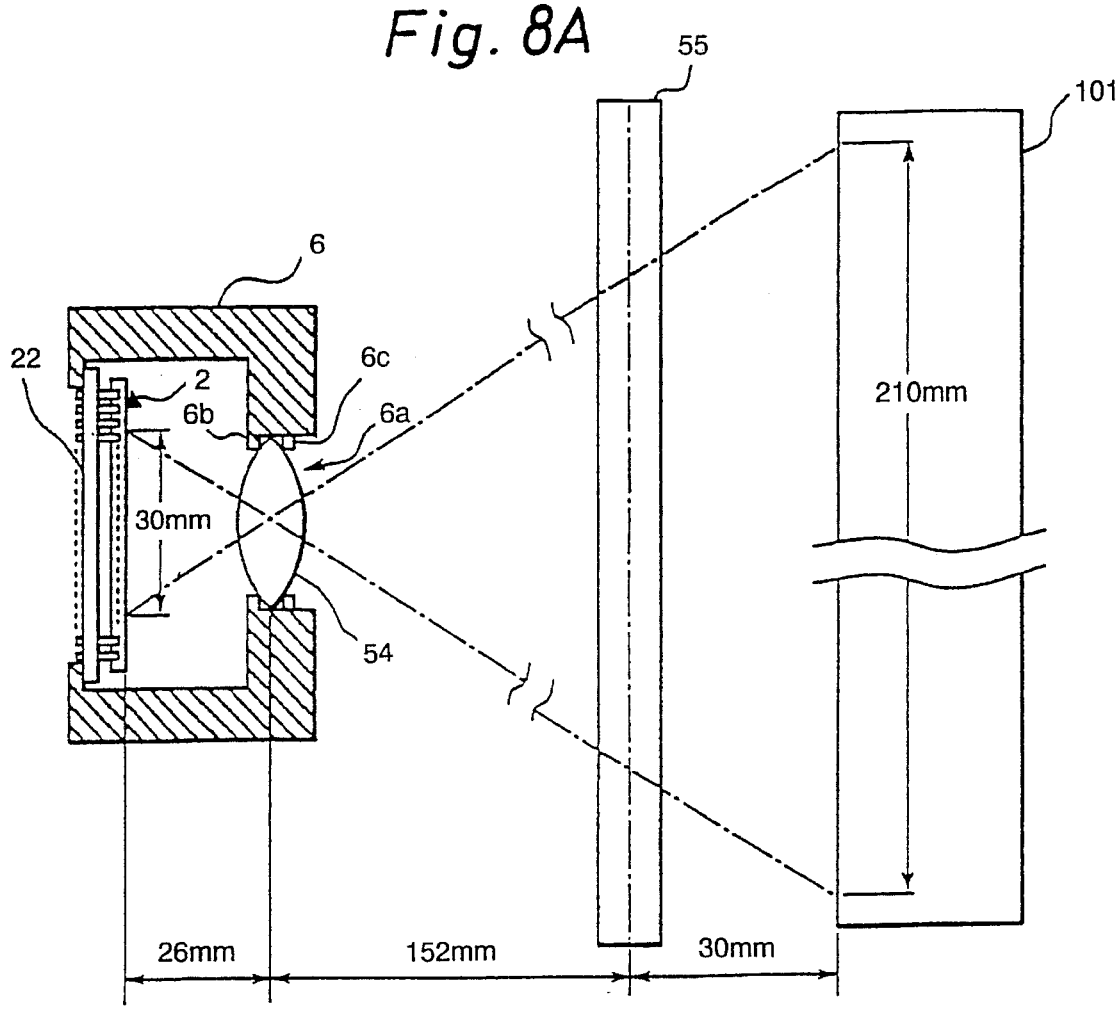
FIGS. 8A, 8B are a plan and a front view of a LED write apparatus of the embodiment of the invention.
Figure 8B:
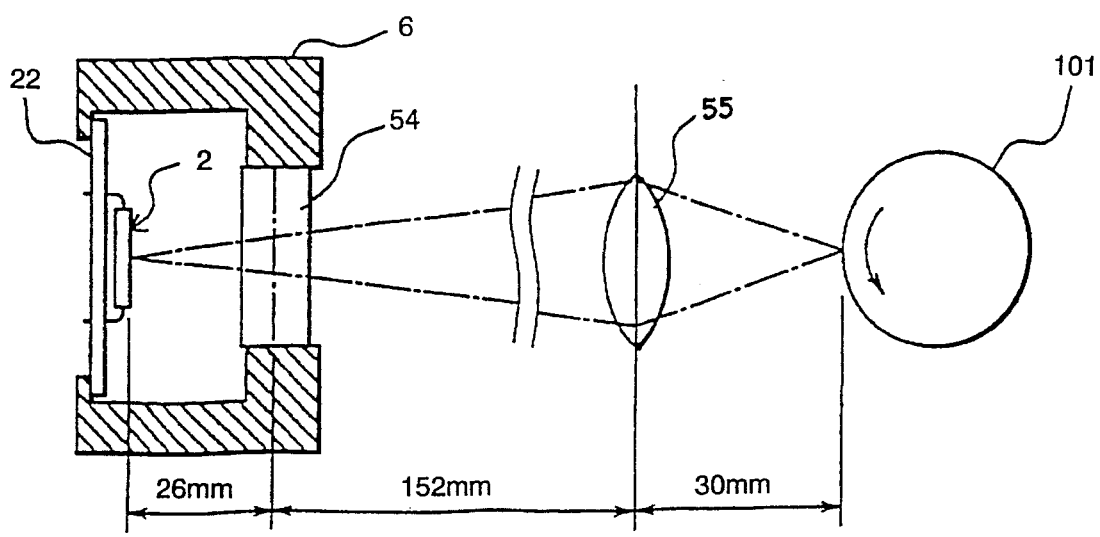
Figure 9:
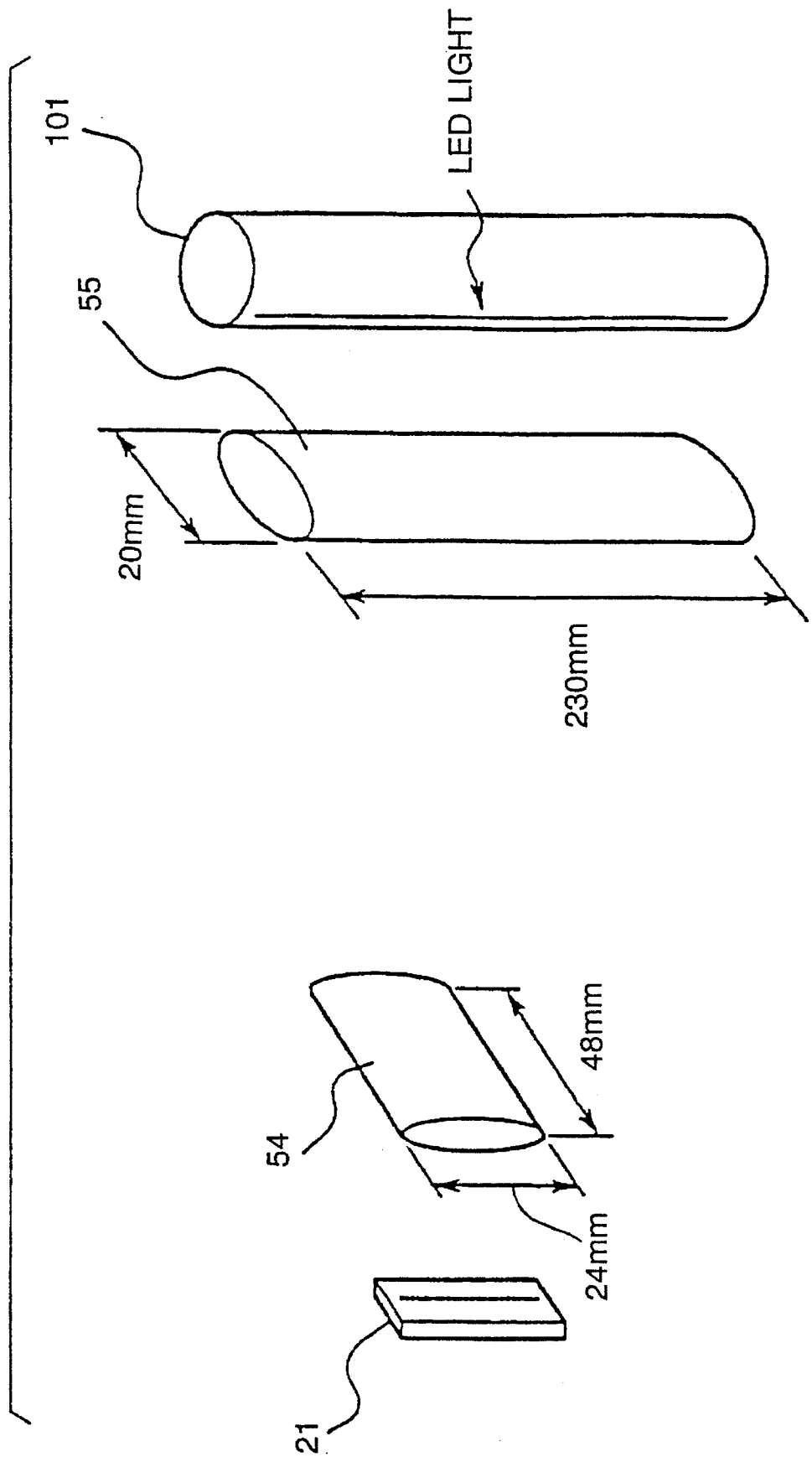
FIG. 9 is a perspective view showing an arrangement of a LED head, a lens and a photosensitive drum.
Figure 10:
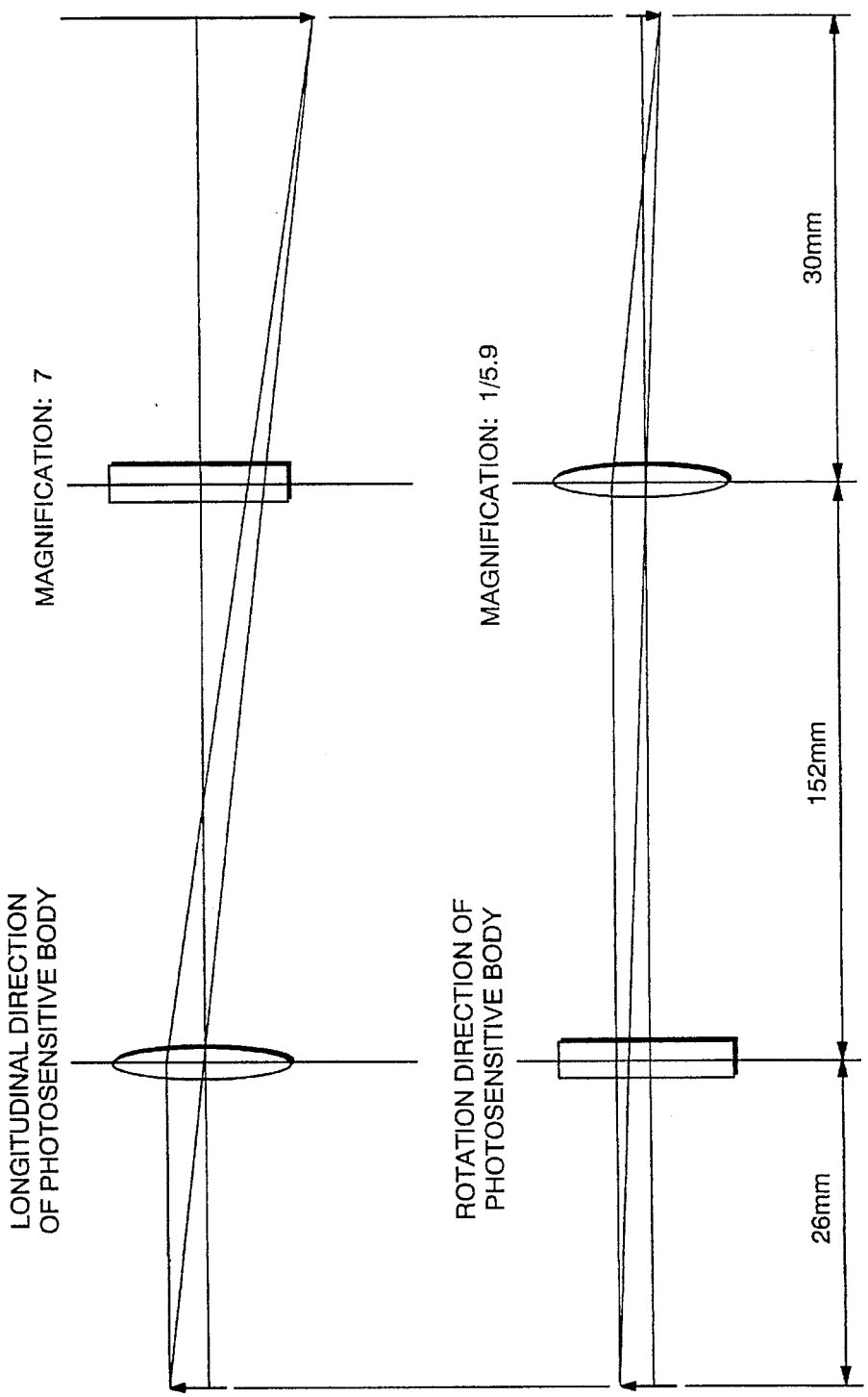
FIGS. 10A, 10B are views showing how light travels in the embodiment of the invention.
Figure 11:
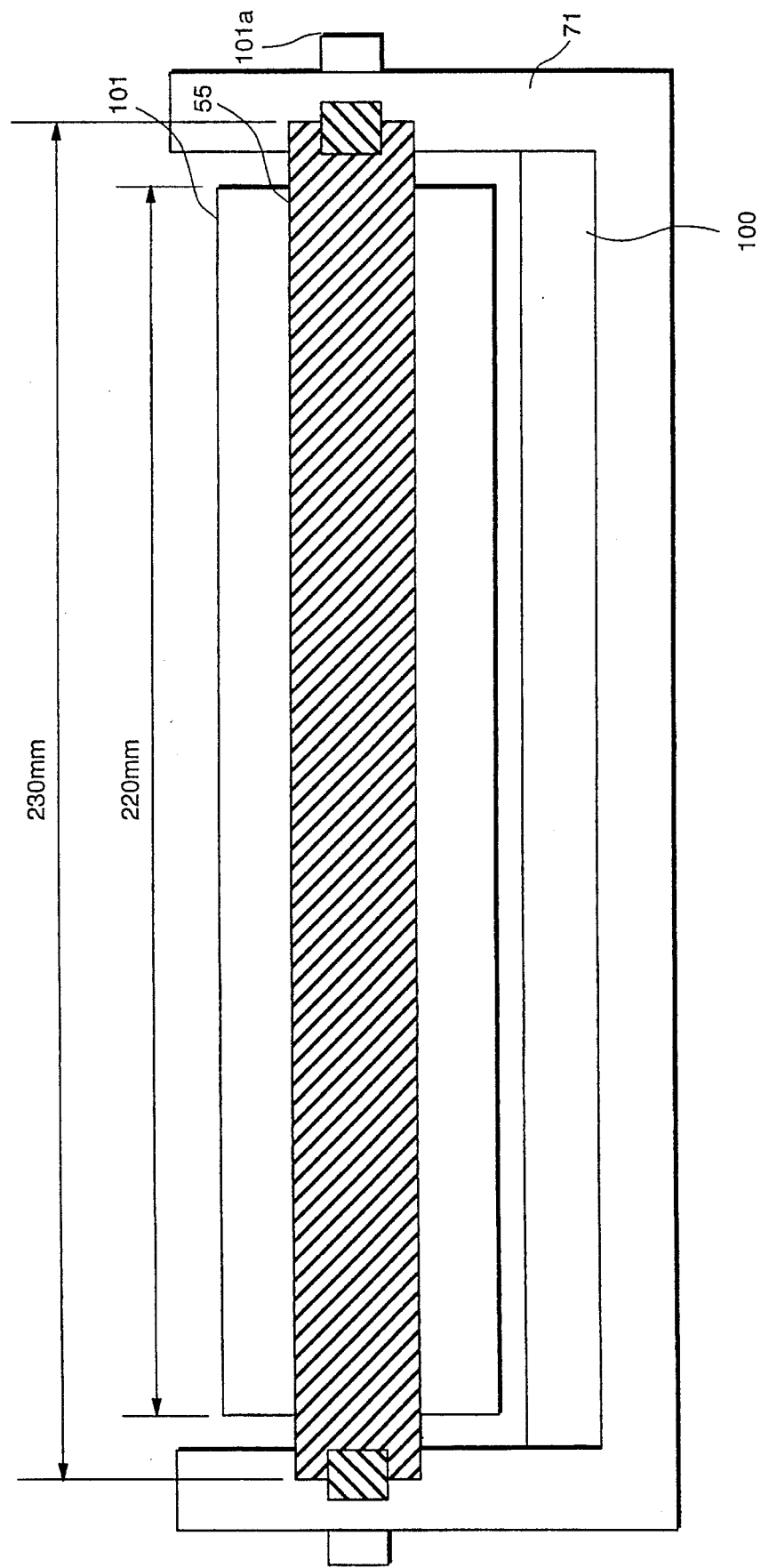
FIG. 11 is a view showing a constitution of a holding part of a second lens.
Figure 12:
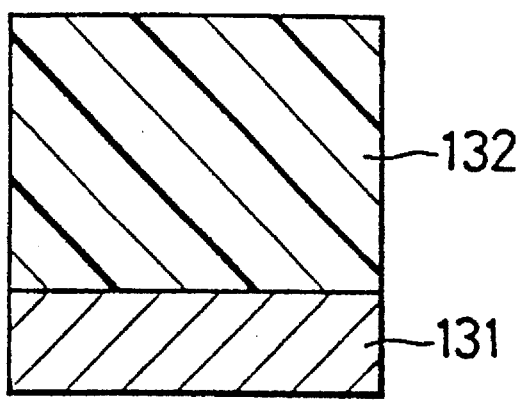
FIG. 12 is a sectional view showing a constitution of a single layer type photosensitive drum.

Now a second embodiment will be described. The second embodiment differs from the above-mentioned first embodiment in shape of LEDs on a LED head chip and in lens constitution guiding the light outputted from the LED head chip to a photosensitive drum. FIGS. 7–11 are views for explaining the second embodiment. FIG. 7 is a plan view of a LED head chip. FIG. 8A is a plan view showing a constitution of a photosensitive drum 101 in a plane direction (a direction along its rotation axis), and FIG. 8B is a front view. FIG. 9 is a perspective view showing an arrangement of a LED head, a lens, and a photosensitive drum. FIGS. 10A, 10B are views showing how light travels in the embodiment of the invention. FIG. 11 is a view showing a constitution of a holding part of a second lens for guiding the light from the LED head chip to the photosensitive drum. The parts corresponding to each other in FIGS. 2A, 2B, and 3 are represented by the same reference numerals.

As shown in FIG. 7, in a LED head chip 51 is arranged a LED substrate 52 made of a GaAs semiconductor substrate on the Si substrate 33 and LEDs 53 are formed on the LED substrate 52. The LED 53 of the embodiment is formed so as to have a rectangular shape in which its length is longer than its width "a" in the LED arrangement direction. By employing such a rectangular shape for the LED, an emission area nearly equal to that of a conventional LED (four sides of 60 μm) can be obtained and as a result a sufficient quantity of emission light can be obtained. The LED having four sides of 10 μm of the above embodiment is not well suited to a high speed image forming apparatus because of insufficient quantity of emission light. To make the LEDs applicable to a high speed image forming apparatus, the shape of the LEDs is enlarged in the length b direction to obtain a large emission area. The shape of the LED is not limited to be rectangular, and for example, an oval LED may be applied. In conclusion, it is a requisite only that the length b is longer than the width a.

Now constitution examples will be described in the case of a rectangular LED 53. When 2400 LEDs 53 are formed on the LED substrate 52, the width a of each LED 53 is required to be about 10 μm in relation to the dimensions of such a semiconductor substrate that can be formed as one chip. Accordingly, in order to obtain the emission area nearly equal to that of a LED having four sides of 60 μm, the length b is selected to be about 360 μm. Thereby a sufficient amount of emission light equivalent to the LED having four dimensions of 60 μm can be obtained.

The light emitted from one LED corresponds to one dot in image formation. It is preferable that the ratio of length to width of one dot is 1:1 because when the ratio exceeds 1:1.5, image quality is degraded. As mentioned above, in the case where the shape of the LED 53 is selected to be rectangular and measure 10 μm×360 μm, the ratio of length and width comes to 1:36, and which is unpractical. For that reason, the light in the length b direction is reduced via a lens.

As shown in FIGS. 8A, 8B, and 9, in the embodiment are a first lens 54 and a second lens 55 is arranged between the LED head 2 and the photosensitive drum 101. The first and second lenses are plate-shaped and have a degree as a lens in only one direction, namely either its length or width direction. The first lens 54 is arranged in the vicinity of the LED head 2 to magnify the light outputted from the LED head chip 51 and project on the photosensitive drum 101. On the other hand, the second lens 55 is arranged in the vicinity of the photosensitive drum 101 to reduce the light output from the LED head chip 51 and project on the photosensitive drum 101. The magnification of the first lens 54 is set to be about 7 from the relation to the size of an image to be formed (210 mm length of A4) and the magnification of the second lens 55 is set to be about 1/5.9 from the relation to the above width to be magnified. Thereby the size of one dot formed on the photosensitive drum 101 comes to about 70 μm×61 μm.

As a result, the light output from the LED head travels as shown in FIGS. 10A, 10B. FIGS. 10A, 10B show a traveling path of light in the LED write apparatus in the direction of the plane of the photosensitive drum 101 (in the direction along the rotation axis of the drum) and the traveling path on the front side of the photosensitive drum 101, respectively. The light outputted from the LED head 2 is magnified in the plane direction seven times via the first lens 54 and projected on the photosensitive drum 101. On the other hand, in the front side direction of the photosensitive drum 101 (image scanning direction), the light outputted from the LED head chip 51 is reduced 1/5.9 times via the second lens 55 and projected on the photosensitive drum 101. Accordingly, a constitution example of the lens arrangement as shown in FIGS. 9, 10A and 10B, is as follows:

distance between LED head chip and first lens : 26 mm distance between first and second lenses : 152 mm distance between second lens and photosensitive drum : 30 mm aperture of first lens : 24 mm length of first lens : 48 mm focal distance of first lens on "degree" side : 22.75 mm aperture of second lens : 20 mm length of second lens : 230 mm focal distance of second lens on "degree" side : 25.67 mm.

The first lens 54 is held by a frame 6 which holds the LED head 2. In this case, while the lens holding part is rectangular, the holding method is the same as that shown in FIG. 2, namely the first lens is held by holding between a stopper 6b integrally formed in the frame 6 and a fixing member 6c inserted into a lens holding member 6a. For example, as shown in FIG. 10, the frame 71 is planted at a rotation axis 101a of the photosensitive drum 101 and the second lens 55 is fixed to the frame 71. Thereby the distance between the second lens 55 and the photosensitive drum 101 can be precisely set.

Figure 13:
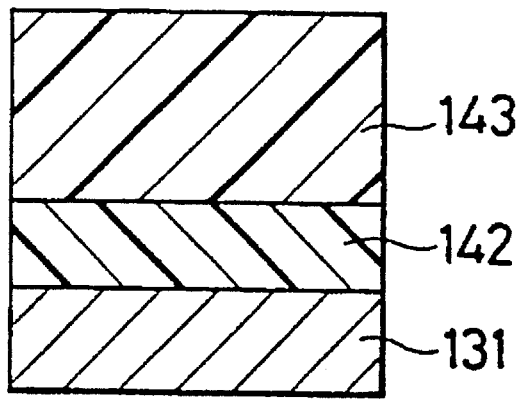
FIG. 13 is a view showing a constitution of a function separated type photosensitive drum.
Figure 14:
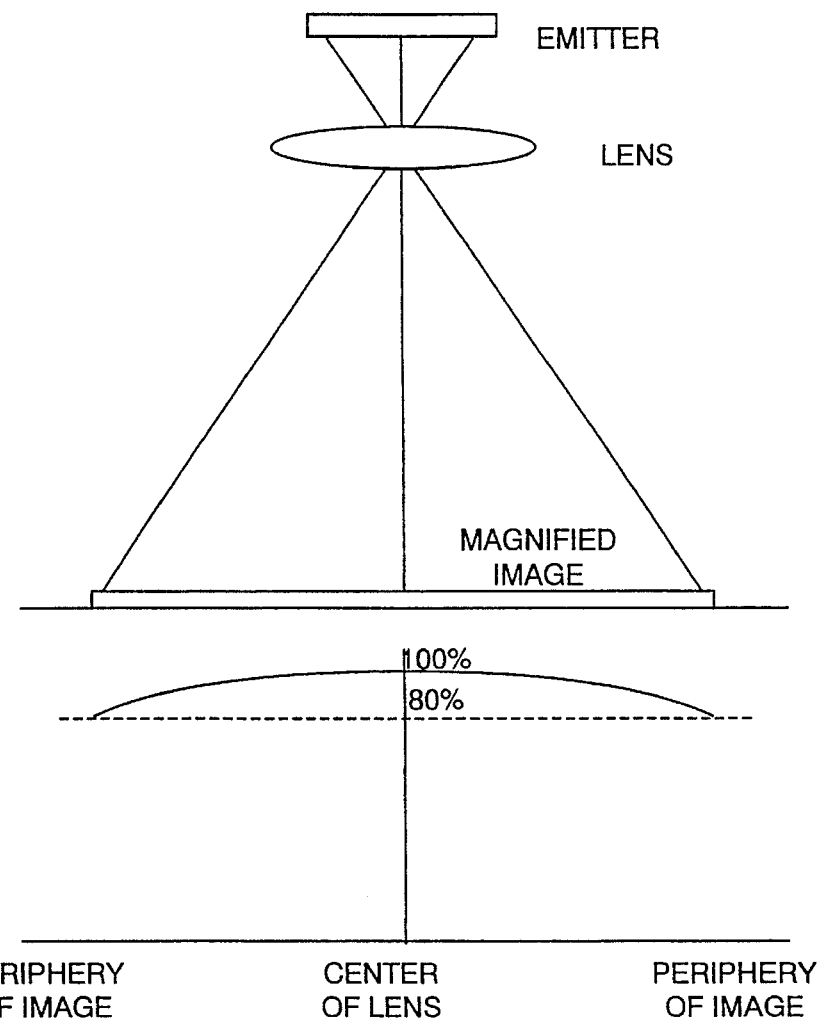
FIG. 14 is a view showing a light intensity characteristic in an usual lens optic system.

Now the method to improve the sensitivity of the photosensitive drum will be described. The OPC photosensitive drum has a constitution as shown in FIGS. 13, 14. FIG. 13 shows a single layer type photosensitive drum, and reference numeral 131 represents a part of a cylindrical aluminum tube, on which a carrier generating member (CGM) which generates a carrier by exposure to light and a carrier transporting member (CTM) 143 which transports the carrier are double-coated, which have thicknesses of 2 to 3 μm and 20 to 30 μm, respectively.

At the present level of technology, a function separated type is usually used with a few exceptions from the aspects of mass-productivity, stability and basic characteristics. As photosensitive materials for a function separated type photosensitive drum are used azo pigments for CGM and hydrazone derivatives for CTM.

The optical sensitivity of the photosensitive drum comes to about 0.3 to 1 μJ/cm$^2$ in general, and it is known that this sensitivity can be improved by optimization of the combination of CGM and CTM materials ( since the materials are organic materials, feasible material combinations are indefinite), the improvement of purity of the materials, the enhancement of concentration of the CGM material, and thin-layer coating. At present, although the sensitivity of a high sensitive photosensitive drum is about 0.1 μJ/cm$^2$ it is possible to improve up to about 0.025 μJ/cm$^2$.

Now the improvement of the lens optic system will be described.

A. Correction of lowered light intensity in the circumferential portion of lens

In a usual optical system, as shown in FIG. 13, the circumferential portion of the lens has a tendency to be dark in comparison with the center the necessity of the correction depends on the selected lens. Particular, this tendency is remarkable in the case of a lens with a small aperture. In the case where the tendency is remarkable, a circuit for controlling the emission current of an integrated light emission element is used, more particularly, a current control resistor 40 is inserted, as shown in FIG. 14, between the LED 32 and the control transistor 34 in the circuit of FIG. 5 to control the current and increase the current value as it goes from the center portion to the circumferential portion, more specifically to correct by decreasing the resistance value of the current control resistor 40 as it goes from the center portion to the circumferential portion.

B. Correction of lens aberration

The following are known as aberrations in a lens optic system, which are improved as follows.

B-1) Chromatic aberration

The invention relates to a LED light source and monochromatic light, and therefore the chromatic aberration is not caused theoretically.

B-2) Spherical aberration

Ideally speaking, the shape of a lens should be spherical. In practical, however, the lens is manufactured to be nearly spherical because of manufacturing easiness and as a result spherical aberration is caused. Because of the spherical aberration, the formed image gets blurred as it goes from the center portion of the lens to the circumferential portion. In order to solve the problem, a high precision lens as spherical as possible is used, only the center portion of a large aperture lens is used, or a combination of plural lenses is used.

B-3) Astigmatism

The processing accuracy of a lens is the cause of the aberration. Particularly, when the axial symmetry of the curved lens surface is problematic, the aberration is caused. To enhance the working accuracy is only a remedy against the problem.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A Light Emitting Diode (LED) write apparatus which forms an image on a recording medium by scanning the recording medium while controlling activation of individual LEDs, the apparatus comprising:

an LED head formed by arranging a plurality of LEDs in a row on a substrate having a smaller width than that of the recording medium, the length of each LED in the direction perpendicular to the row direction of the LEDs being longer than the width of each LED in the row direction, and magnifying/projecting means for magnifying the width of light in a direction along the row LEDs from the LED head to the width of the recording medium, projecting the magnified light onto the recording medium, and reducing the width of light in the perpendicular direction from the LED head to that nearly equal to the width of the light of one LED in the row direction.

2. The apparatus according to claim 1, wherein each of the LEDs is rectangularly shaped.

3. The apparatus according to claim 1, wherein each of the LEDs is ovally shaped.

4. A system for forming an image on a recording medium by scanning the recording medium and activating individual Light Emitting Diodes (LEDs) in an LED write apparatus, comprising:

an LED head including a plurality of LEDs arranged in a row on a single substrate having a width smaller than that of the recording medium;

driver circuitry arranged on the single substrate for individually activating the LEDs in response to image signals received by the driver circuitry; and optics for modifying light generated by the LED head including magnifying a width of light generated by the LED head in a direction parallel to the row of LEDs and reducing a width of light generated by the LED head in a direction perpendicular to the row of LEDs, and thereafter, projecting the modified light onto the recording medium, wherein LED light in a direction parallel to the row of LEDs is magnified to the width of the recording medium and LED light in a direction perpendicular to the row of LEDs is reduced depending on the length and width of the individual LEDs to offset image distortion in the perpendicular direction caused by the magnification in the perpendicular direction and to offset differences between LED length and LED width.

5. The system according to claim 4, wherein the driver circuitry and LEDs are electrically connected during a semiconductor process used to arrange the LEDs and driver circuitry on the same substrate.

6. The system according to claim 5, wherein the LEDs are connected to corresponding driver transistors included in the driver circuitry using an aluminum vapor deposition/etching procedure.

7. The system according to claim 4, wherein the LEDs are formed on an LED film formed on the single substrate and the driver circuitry is formed directly on the single substrate.

8. The system according to claim 7, wherein the LED film is a gallium arsenic film and the single substrate is a silicon substrate.

9. The system according to claim 4, wherein the single substrate is a gallium arsenic substrate and the LEDs and driver circuitry are both formed on the gallium arsenic substrate.

10. The system in claim 4, wherein the length of each LED is about six times larger than the LED width.

11. The system in claim 4, wherein the LED length is about 360 micrometers and the LED is about 10 micrometers.

12. The system in claim 4, wherein the ratio of LED length to LED width is greater than 25.

13. The system according to claim 12, wherein the ratio is 36.

14. The system in claim 4, wherein the width of light in the perpendicular direction is reduced to be about the same width of one LED.

15. The system in claim 4, wherein the magnification is on the order of 7 and the reduction is 0.5 or greater.

16. A Light Emitting Diode (LED) write apparatus which forms an image on a recording medium by scanning the recording medium while activating individual LEDs, comprising:

an LED head including a plurality of LEDs formed in a row on a substrate having a smaller width than a width of the recording medium, each LED having an LED length larger than an LED width, optics for modifying light generated by the LED head including magnifying a width of light generated by the LED head in a direction parallel to the row of LEDs and reducing a width of light generated by the LED head in a direction perpendicular to the row of LEDs, and thereafter, projecting the modified light onto the recording medium, wherein LED light in a direction parallel to the row of LEDs is magnified to the width of the recording medium and LED light perpendicular to the row of LEDs is reduced depending on the length and width of the individual LEDs to offset image distortion in the perpendicular direction caused by the magnification in the perpendicular direction.

17. The system in claim 16, wherein the length of each LED is about six times larger than the LED width.

18. The system in claim 16, wherein the LED length is about 360 micrometers and the LED is about 10 micrometers.

19. The system in claim 16, wherein the ratio of LED length to LED width is greater than 25.

20. The system according to claim 19, wherein the ratio is 36.

21. The system in claim 16, wherein the width of light in the perpendicular direction is reduced to be about the same width of one LED.

22. The system in claim 16, wherein the LED light magnification in the parallel direction is on the order of the 7 and LED light reduction in the perpendicular direction is on the order of 0.5 or greater.

23. In a system which forms an image on a recording medium by scanning the recording medium and activating individual Light Emitting Diodes (LED), a method comprising:

arranging a plurality of LEDs in a row on a substrate having a smaller width than a width of the recording medium:

a length of each LED in a direction perpendicular to the row of LEDs being larger than a width of the LEDs in a direction parallel to the row of LEDs;

reducing LED light perpendicular to the row of LEDs depending on the size of the LEDs to substantially offset image distortion in the perpendicular direction caused by the LED light magnification in the perpendicular direction and to offset differences between the LED length and LED width, and magnifying light generated by the LEDs in the row direction up to the width of the recording medium.

24. The system in claim 23, wherein the length of each LED is about six times larger than the LED width.

25. The system in claim 23, wherein the LED length is about 360 micrometers and the LED is about 10 micrometers.

26. The system in claim 23, wherein the ratio of LED length to LED width is greater than 25.

27. The system according to claim 26, wherein the ratio is 36.

28. The system in claim 23, wherein the width of light in the perpendicular direction is reduced to be about the same width of one LED.

29. The system in claim 23, wherein the light magnification in the parallel direction is on the order of 7 and the light reduction in the perpendicular direction is 0.5 or greater.

* * * * *